United States Patent [19]
Koster

[11] 3,980,840
[45] Sept. 14, 1976

[54] CONDUCTOR IDENTIFICATION ARRANGEMENT FOR A CABLE RESTORATION SYSTEM

[75] Inventor: Frederick Henry Koster, Granite Springs, N.Y.

[73] Assignee: American Telephone and Telegraph Company, New York, N.Y.

[22] Filed: Mar. 27, 1975

[21] Appl. No.: 562,987

[52] U.S. Cl. .......................................... 179/175.3 A
[51] Int. Cl.² .......................................... H04B 3/46
[58] Field of Search ............. 179/175.3 A, 175.3 R, 179/175, 84 L, 2 A; 324/66

[56] References Cited
UNITED STATES PATENTS

| | | | |
|---|---|---|---|
| 3,375,334 | 3/1968 | Robinson | 179/175.3 A |
| 3,739,107 | 6/1973 | Spencer | 179/175.3 R |
| 3,814,870 | 6/1974 | Miller | 179/175.3 R |

*Primary Examiner*—Douglas W. Olms
*Attorney, Agent, or Firm*—F. W. Padden; E. J. Olinder

[57] ABSTRACT

In a cable restoration system neon devices and light-emitting diodes are utilized to identify corresponding conductors in a broken cable by an arrangement that does not require the assistance of a lineman at the central office. The apparatus identifies a central office line by means of a neon device and ringing bridge arrangement which replaces the neon indicating bulbs used in prior art systems. After identifying a customer line at a cable break by using indicating devices in a conventional manner, a maintenance man at the break location dials the central office over a spare pair. When ringing is applied to the desired central office line, a glow discharge occurs in the neon device, which discharge heats a bi-metallic strip and causes the strip to move and establish a metallic short across the line. The short trips ringing extinguishing the discharge. The bi-metallic strip cools and the short is removed from the line. The maintenance man then applies a high frequency tone signal to the spare pair which signal appears on the desired line after passing through the central office. The tone is detected by a ringing bridge and used to illuminate a light-emitting diode which identifies the desired line.

11 Claims, 3 Drawing Figures

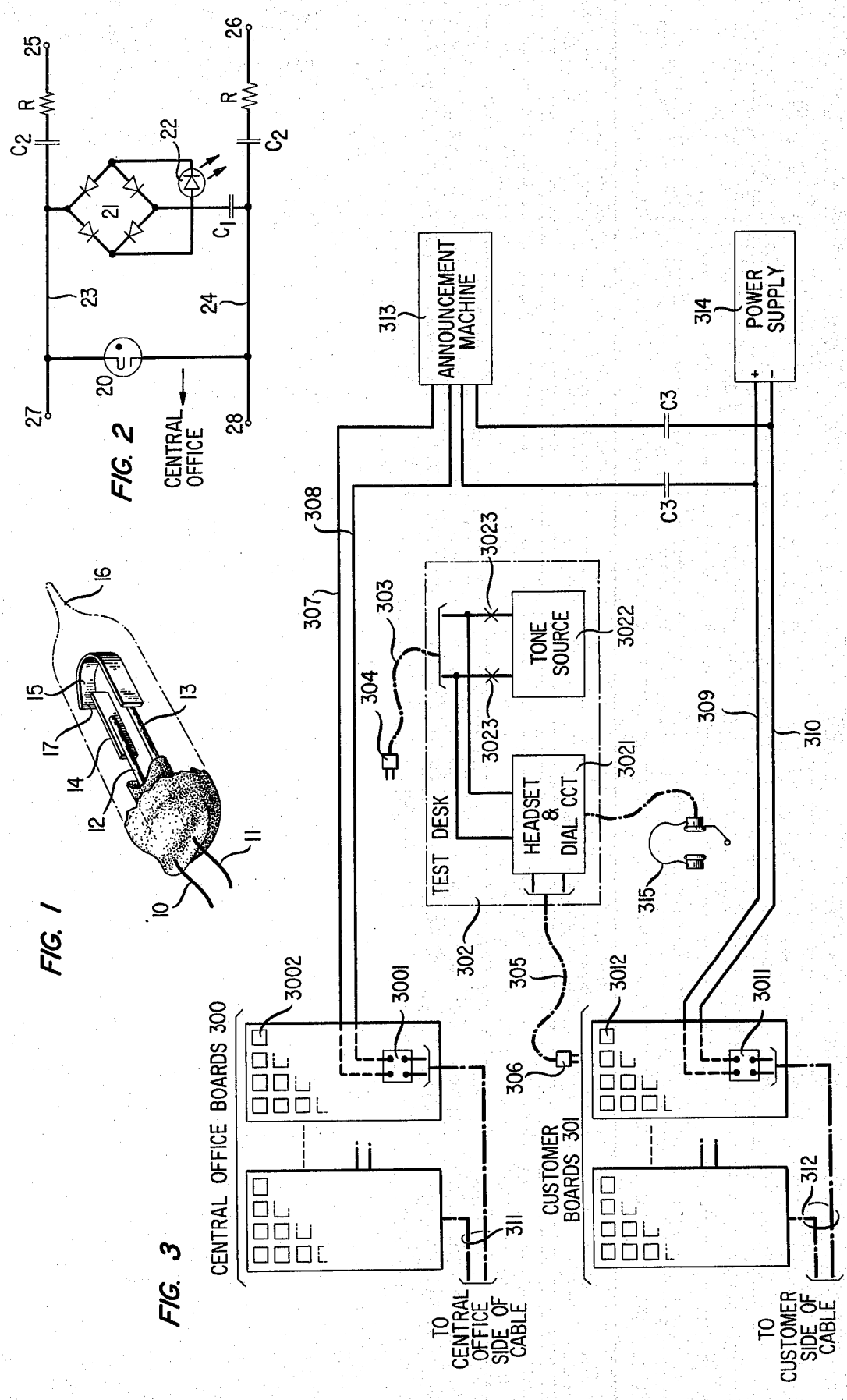

CONDUCTOR IDENTIFICATION ARRANGEMENT FOR A CABLE RESTORATION SYSTEM

BACKGROUND OF THE INVENTION

This invention relates to maintenance systems and, in particular, to cable restoration systems for temporarily restoring service to customers whose central office cable has been damaged.

Various restoration systems have been utilized to restore service to customers after their central office cable has been damaged by fires, floods, or other disasters. These systems typically utilize neon bulbs or light-emitting diodes that are connected to the ends of a cable break and operate as follows: When a customer goes off-hook to request service, the indicating device connected to his line is illuminated by means of battery power supplied at the cable break. A maintenance man operating the system then connects to the indicated line and asks the customer his directory number. After receiving the number, the maintenance man contacts a lineman at the central office and requests ringing on the line which corresponds to the customer's number. When ringing is applied to the proper line, the indicating device (associated with the line) lights and identifies the line to the maintenance man located at the cable break. The wires which are thereby identified may be spliced together to provide temporary service of the customer until a permanent splice in the cable can be made.

In this type of system, neon bulbs are typically used on the central office side of the break because such devices are inexpensive and respond directly to central office ringing to provide a visual indication. However, when neon bulbs are used to identify the central office lines, the assistance of a lineman at the central office is required to distinguish the identifying ringing from ringing caused by normal incoming calls. The central office will, in the normal course of operations, attempt to complete incoming calls to customers whose service has been impaired by the broken cable. In the process, the central office will apply ringing to the line. This ringing will, of course, be applied in the normal on and off cyclic pattern; therefore, in order to distinguish the desired line from other lines which may be illuminated by incoming ringing, the lineman in the central office must manually apply distinctive ringing (a different on and off pattern alternately to the tip and ring sides of the line or some other variation). The restoration operation therefore requires at least two maintenance personnel and is therefore cumbersome and expensive.

It is apparent that there is a need for a cable restoration system which can be operated by maintenance personnel located only at the cable break and which does not require the assistance of maintenance personnel at the central office.

Accordingly, it is an object of the present invention to identify a desired central office conductor without the assistance of maintenance personnel in the central office.

It is a further object of the present invention to perform identification of the central office line without using expensive circuitry at the cable break location.

SUMMARY OF THE INVENTION

The foregoing and other objects are achieved in accordance with the principles of the present invention in one illustrative embodiment thereof wherein apparatus is connected to each conductor in the central office side of a broken cable, which apparatus is arranged to trip incoming ringing. Customers connected to the broken cable are contacted and their directory numbers identified. A customer number is then dialed into the central office via a test line. The central office thereupon connects the line corresponding to the directory number to the test line. A maintenance person operating the cable restoration system then places a tone signal on the test line, which tone signal passes through the central office to the called line. The tone signal and the desired line are located by detection circuitry connected to the central office side of the cable break.

Specifically, a neon device is connected across the central office line to respond to identifying ringing by momentarily placing a metallic short across the line. The metallic short causes the central office to trip ringing and connect the line to the calling line. After the short is removed, a maintenance man operating the system then places a high frequency tone on the calling line, which tone appears on the called line and is detected by a ringing bridge. The output of the ringing bridge is used to drive a light-emitting diode, which diode identifies the desired line.

More specifically, in the operation of the restoration system, maintenance personnel first identify a service requesting customer's line by means of suitable indicating devices. After obtaining the customer's directory number by oral communication with the customer, a maintenance person dials the directory number into the central office over a spare line. The central office thereupon applies ringing to the desired line which is bridged by the aforementioned neon device. The neon device contains a bi-metallic strip which is heated by a glow discharge that occurs when ringing is applied. Upon being heated, the bi-metallic strip moves to make metallic contact with another electrode in the device.

The current drawn by the glow discharge in the neon device is insufficient to trip ringing; however, the metallic short across the line causes the central office to trip ringing and establish a connection from the calling line to the desired line.

After ringing has been tripped, the bi-metallic strip cools and the metallic short is removed. The maintenance man at the cable break location thereupon applies a high frequency tone, which tone is detected at the desired line by a diode bridge. Current from the diode bridge operates a light-emitting diode to identify the line. Only the desired line is illuminated by the high frequency tone and thus, the assistance of maintenance personnel at the central office is not required to distinguish the desired line from signals due to incoming calls on other lines.

BRIEF DESCRIPTION OF THE DRAWING

FIG. 1 of the drawing is a pictorial diagram of a neon bulb device containing a bi-metallic strip;

FIG. 2 of the drawing shows the neon bulb device of FIG. 1 incorporated into a circuit together with a diode bridge and light-emitting diode for line identification; and FIG. 3 of the drawing is a schematic diagram of a cable restoration system in which the circuit shown in FIG. 2 may be utilized to provide restoration of service to customers whose cable has been damaged.

DETAILED DESCRIPTION

FIG. 1 of the drawing shows a gas-filled tube which is used in my illustrative system to trip ringing from the central office. The device consists of glass envelope 16 which is filled with an inert gas such as neon or argon. Two electrical leads 10 and 11 are provided which are connected to electrodes 12 and 13 inside the device. Electrodes 12 and 13 are provided with bi-metallic strips 14 and 15, which strips are arranged with a gap 17 preventing the strips from making electrical contact. When a voltage of sufficient magnitude is placed across leads 10 and 11, a glow discharge occurs in gap 17. Bi-metallic strips 14 and 15 are arranged so that the heat produced by the glow discharge causes the strips to move towards each other, eventually providing a metallic electrical contact between electrodes 12 and 13. The length of time between the application of a voltage to leads 10 and 11 and the production of a direct metallic contact is dependent on the physical composition of bi-metallic strips 14 and 15 and the size of gap 17 between the strips. The gas-filled tube is one of many other devices that are well known in the art which may also be used in my illustrative system to trip ringing.

This gas-filled device is similar to devices utilized in fluorescent light starters to establish an electrical contact in order to light the fluorescent tube. In the instant device, however, the composition and spacing of the bi-metallic strips is chosen so that direct electrical contact is established between the strips for a 0.5 to 1.5 second interval. This timing interval is necessary in order to have the device function properly with all types of central office switching machines. In particular, many central offices require a metallic short to be placed across the line in order to establish a communications connection within the office, but this short must be established for less than two seconds after ringing has been tripped (in order to prevent charging for the call, as hereinafter described). Thus, a holding time of between 0.5 and 1.5 seconds should give proper operation with all types of central offices. In the illustrative embodiment shown, a suitable metal for bi-metallic strips 14 and 15 is Truflex bi-metallic material P675R manufactured by the Texas Instruments, Inc., Attleboro, Massachusetts. A suitable spacing (gap 17) between bi-metallic strips 14 and 15 may be on the order of 0.040 inches.

FIG. 2 is a schematic diagram of an electrical circuit in which the device shown in FIG. 1 is incorporated to trip ringing. In FIG. 2, neon device 20, corresponding to the device discussed above, is directly connected across conductors 23 and 24. In operation of the cable restoration system, as will be hereinafter discussed, conductors 23 and 24 are connected to the tip and ring conductors of a central office line at a cable break location. Therefore, when ringing is applied to the line, device 20 will trip ringing by establishing momentarily a metallic short across the line. Also shown in FIG. 2 is a diode bridge 21 in series with capacitor C1, which diode bridge is also connected across conductors 23 and 24. Light-emitting diode 22 is connected across diode bridge 21 so that when an alternating current signal of sufficiently high frequency is applied to conductors 23 and 24, the direct current signal developed by diode bridge 21 is applied to light-emitting diode 22 to cause it to be illuminated. Diode bridge 21 and light emitting diode 22 are used to identify the central office line during the operation of the restoration system. However, light-emitting diode 22 is not illuminated by the ringing applied by the central office because capacitor C1 is of such a size that the current flowing through diode bridge 21 is insufficient to illuminate light-emitting diode 22. Light-emitting diode 22 is illuminated during a later portion of the restoration operation as will hereinafter be described. Capacitors C2 and resistors R provide isolation of the circuit when it is placed into a restoration system and connected to an announcement machine.

FIG. 3 of the drawing shows a cable restoration system in which the electrical circuit of FIG. 2 may advantageously be used to identify central office conductors in a damaged cable section without the assistance of maintenance personnel at the central office. The construction and operation of the restoration system will only be discussed to an extent necessary for an understanding of the present invention. A full discussion and disclosure of a cable restoration system such as that shown in FIG. 3 can be found in my copending application entitled "Cable Restoration System" filed Oct. 24, 1974, Ser. No. 517,401, which issued on Oct. 14, 1975, as U.S. Pat. No. 3,912,885. The system may be used to temporarily restore service when a multiconductor cable is damaged. In order to identify corresponding conductors in the damaged cable, a set of indicating boards 300 is connected to the central office side of the cable break via restoration cables 311. Boards 300 are connected so that each position such as positions 3001 and 3002 on boards 300 is connected to the tip and ring conductors of a single line in the damaged cable. A set of indicating boards 301 is similarly connected to the customer side of the cable break via restoration cables 312. The array of pin grip positions such as positions 3011 and 3012 receive a set of plugs (not shown) containing indicating lights for identifying a particular line. For example, position 3011 on boards 301 has four pin grip jacks; one pair of pin grip jacks is connected with the tip and ring conductor of a customer line via cable 312. The other pair of pin grip jacks is connected to power supply 314 by means of leads 309 and 310 and announcement machine 313 by means of capacitors C3. When a plug containing indicating devices is plugged into position 3011, one indicating device is placed in series with the tip conductor and lead 309. The other indicating device is connected in series with the ring conductor and lead 310. All other positions on boards 301 are similarly connected to a customer line and multipled to leads 309 and 310. Thus, when a customer goes off-hook to request service, a circuit is closed which allows current to flow from power supply 314 through the indicating devices (not shown) and the subscriber cable loop (not shown) causing the indicating devices to light and identify the line. The plug containing the lighted indicating devices is then removed and test cord 305 is plugged into the location by means of plug 306. Maintenance personnel operating the system may then orally communicate with the customer by using headset 311 in conjunction with the headset and dial circuit 3021 to ascertain the directory number corresponding to the cutomer's line.

After receiving the customer's directory number, maintenance personnel plugs test cord 303 and plug 304 into an unused position on one of boards 300 such as position 3002 and dials the directory number obtained from the customer into the central office by means of dial circuit 3021. The central office will respond by establishing a connection to the line corresponding to the directory number and placing ringing thereon. The ringing voltage will appear on the position on boards 300 which is connected to the line. However, according to my invention, all of the positions on boards 300 have been provided with a plug (not shown) that contains the circuit shown in FIG. 2 of the drawing. The plug is inserted into the positions on boards 300 so that terminals 27 and 28 (shown in FIG. 2) are connected to the tip and ring conductors of a central office line. Terminals 25 and 26 are connected to the announcement machine 313 (FIG. 3) via leads 307 and 308. This connection supplies a recorded announcement to regular customers who are attempting to complete incoming calls to lines in the damaged cable as will hereinafter be described.

After the desired directory number has been dialed into the central office by maintenance personnel operating the restoration system and ringing has been applied by the central office to the desired line, device 20, as shown in FIG. 2, responds by tripping ringing by placing a momentary metallic short access the line as described above. The metallic short appears to the central office as an "answer" and causes the office to establish a communications connection between the calling line (test desk 302 via test lead 303) and the desired line appearing at one position on boards 300. However, light-emitting diode 22, as shown in FIG. 2, does not respond to the central office ringing because of capacitor C1, as previously described. Thus, light-emitting diode 22 remains unlit.

When metallic contact is established by device 20 in FIG. 2, the glow discharge between the electrodes of the devices is extinguished, the electrodes begin to cool, and within 0.5 to 1.5 seconds the metallic short is removed. Since ringing was tripped when device 20 initially responded, there is no ringing voltage provided by the central office to reestablish a glow discharge in device 20 after the metallic short is removed. Consequently, the "answer supervision" provided by device 20 is removed shortly after ringing is tripped. When answer supervision is removed, the central office will respond by disconnecting the connection between the calling and called lines. However, the disconnection process is not initiated for approximately 10 to 30 seconds in most central offices. The delay is usually provided to prevent transients on the line from inadvertently causing the system to disconnect. Thus, there will be approximately a 10-second delay after ringing is tripped during which time the restoration system is still connected through the central office to the desired line but the metallic short on the line has been removed.

During this 10-second interval (after ringing has ceased), a maintenance person connected to the line by means of test desk 302 applies a high frequency tone to the calling line by closing contacts 3023 in test desk 302 to connect tone source 3022 to test cord 303. This high frequency tone passes through the central office and appears at the desired line located on a position of one of boards 300. As mentioned previously, each position on boards 300 is provided with a plug containing the circuit shown in FIG. 2. The high frequency tone applied to the line has insufficient voltage to cause a glow discharge in the neon device 20 in FIG. 2 associated with the line. However, the high frequency tone is rectified by diode bridge 21. Capacitor C1 has a value sufficiently large to allow current flowing through bridge 21 to illuminate light-emitting diode 22. Thus, only the desired line is identified by lighted diode 22. (Diode 22 is not illuminated by ordinary ringing voltage as previously described.) In order to complete the restoration operation, the maintenance man operating the maintenance system ascertains the number of the position corresponding to the central office line on boards 300 and installs a cross connection (not shown) to establish temporary service for the service requesting customer.

The circuit shown in FIG. 2 also advantageously terminates normal incoming phone calls and provides a recorded announcement to the calling party informing him that the line has been damaged and service restoration is underway. For example, when incoming ringing is applied to the circuit shown in FIG. 2, device 20, as previously discussed, operates to trip ringing and provides a metallic short across the line causing the calling line to be connected to conductors 23 and 24 of the circuit. However, also, as previously discussed, once the metallic short is established and ringing is removed, device 20 cools down and removes the metallic short. The electrode spacing and bimetallic strip materials in device 20 are chosen so that the metallic short on the line is removed within 0.5 to 1.5 seconds after ringing has been tripped. Since most central offices require at least two seconds of answer supervision before charging begins, the metallic short or "answer supervision" is removed before charging is started, thus the customer is not charged for the call. However, also as previously discussed, the connection between the calling and called lines is not removed by the office for approximately 10 to 30 seconds after answer supervision is removed. Therefore, the customer remains connected to the line and receives an announcement by means of the circuit including conductors 23 and 24 in FIG. 2, capacitors C2 and resistors R, terminals 25 and 26, conductors 307 and 308 (FIG. 3), and announcement machine 313. Anouncement machine 313 provides the calling customer with an appropriate message informing him of the situation.

In the illustrative embodiment shown, the following component values may be used: $C_1 = 0.5$ $\mu f$; $C_2 = 0.1$ $\mu f$; $R = 5K\Omega$. The high frequency tone used to identify the central office line may illustratively be 3000 Hz.

What is claimed is:

1. In a cable restoration system for temporarily providing service to telephone customers whose normal service has been interrupted by a break in a multiconductor cable connecting said customers to their serving central office, said system having means for identifying a service requesting customer line at said cable break and for ascertaining the directory number thereof and means connected to a test line appearing at said serving central office for dialing said directory number into said central office, said central office thereupon applying ringing to the line corresponding to said directory number, an arrangement for identifying the central office line at said cable break corresponding to said directory number comprising:
   means for tripping said ringing, said central office thereupon connecting said test line to said line corresponding to said directory number;
   means for applying a tone signal to said test line, said tone signal passing through said central office and appearing on said line corresponding to said directory number;
   means connected to each pair of conductors in said cable for detecting said tone signal; and indicating means responsive to the detection of said tone signal at said line corresponding to said directory number for locating said line.

2. An arrangement for identifying a central office line according to claim 1 wherein said means for tripping said ringing further comprises means for detecting said ringing on said line corresponding to said directory number and means responsive to the detection of said ringing for applying a metallic short across said line corresponding to said directory number for a predetermined interval of time after said ringing has been tripped.

3. An arrangement for identifying a central office line according to claim 2 wherein said means for detecting said ringing further comprises a gas discharge tube having a pair of electrodes, said tube having a low impedance and a high impedance state state and means for applying said ringing to said gas discharge tube to cause a discharge to be initiated therein to place said tube in said low impedance state to dectect said ringing.

4. An arrangement for identifying a central office line according to claim 3 wherein said means for applying a metallic short across said line further comprises a pair of electrodes, at least one of said electrodes being composed of a bi-metallic material, said electrodes being connected to said line for applying a short thereto in response to heat produced by said discharge.

5. An arrangement for identifying a central office line according to claim 1 wherein said means for detecting said tone signal further comprises means operable for rectifying said tone signal to produce a direct current signal therefrom and means for operating said rectifying means in response to said tone signal and for preventing the operation of said rectifying means in response to said ringing.

6. An arrangement for identifying a central office line according to claim 5 wherein said indicating means is connected to said rectifying means and further comprises means responsive to said direct current signal for producing a visual indication of the presence of said tone signal.

7. An arrangement for identifying a central office line corresponding to a service requesting customer line at a cable break location comprising means for dialing the directory number corresponding to said customer line into the central office, said central office thereupon applying a ringing signal to said central office line, means responsive to the appearance of said ringing signal on said central office line for returning answer supervision to said central office, said central office thereupon completing a communication connection to said central office line;

means for introducing a tone signal into said communications connection, said tone signal appearing on said central office line, and means responsive to the appearance of said tone signal for identifying said central office line.

8. An arrangement for identifying a central office line accordance to claim 7 wherein said means for returning answer supervision further comprises means for detecting said ringing signal, and means responsive to the detection of said ringing signal for applying a temporary metallic short across said central office line to cause said central office to establish said communications connection.

9. An arrangement for identifying a central office line according to claim 7 wherein said means for identifying said central office line further comprises means for detecting said tone signal and means responsive to the detection of said tone signal for visually identifying said central office line.

10. An arrangement for identifying a central office line according to claim 9 wherein said means for detecting said tone signal further comprises a diode bridge for rectifying said tone signal to produce a direct current signal therefrom and a capacitor connected in series with said diode bridge to prevent said diode bridge from responding to said ringing signal and said means for visually identifying said central office line comprises a light-emitting diode connected across said diode bridge for producing a visual signal response to said direct current signal.

11. A method for identifying a central office line corresponding to a service requesting customer line at a cable break location comprising the steps of 1. Ascertaining the directory number of said customer line;
2. Dialing said directory number into said central office, said central office thereupon applying ring to said central office line;
3. Applying a low impedance across said central office line to trip said ringing and cause said central office to make a communications connection to said central office line;
4. Injecting a tone signal into said communications connection, said tone signal appearing on said central office line; and
5. Detecting said tone signal at said cable break location to identify said central office line corresponding to said directory number.

* * * * *